United States Patent
Chen et al.

(10) Patent No.: US 9,337,212 B2
(45) Date of Patent: May 10, 2016

(54) FLEXIBLE DISPLAY SUBSTRATE AND MANUFACTURING METHOD THEREOF, AND FLEXIBLE DISPLAY DEVICE

(71) Applicant: BOE TECHNOLOGY GROUP CO., LTD., Beijing (CN)

(72) Inventors: Liqiang Chen, Beijing (CN); Tao Gao, Beijing (CN); Weifeng Zhou, Beijing (CN); Xue Mao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/408,073

(22) PCT Filed: Apr. 25, 2014

(86) PCT No.: PCT/CN2014/076246
§ 371 (c)(1),
(2) Date: Dec. 15, 2014

(87) PCT Pub. No.: WO2015/043176
PCT Pub. Date: Apr. 2, 2015

(65) Prior Publication Data
US 2015/0380439 A1    Dec. 31, 2015

(30) Foreign Application Priority Data
Sep. 25, 2013   (CN) .......................... 2013 1 0450966

(51) Int. Cl.
*H01L 27/14* (2006.01)
*H01L 27/12* (2006.01)

(52) U.S. Cl.
CPC ........ *H01L 27/1218* (2013.01); *H01L 27/1222* (2013.01); *H01L 27/1266* (2013.01)

(58) Field of Classification Search
CPC ............................ H01L 27/1214; H01L 27/12
USPC ............................................. 257/72; 438/29
See application file for complete search history.

(56) References Cited

U.S. PATENT DOCUMENTS

| 2006/0145091 A1* | 7/2006 | Patel | G01T 1/04 250/474.1 |
| 2010/0245991 A1* | 9/2010 | Ishihara | G02B 5/0858 359/360 |
| 2013/0044282 A1* | 2/2013 | Kuwabara | G02F 1/1333 349/96 |

FOREIGN PATENT DOCUMENTS

| CN | 101246287 A | 8/2008 |
| CN | 101577289 A | 11/2009 |

(Continued)

OTHER PUBLICATIONS

Notification of the First Office Action dated Jun. 24, 2014 corresponding to application No. 201310450966.0.

(Continued)

*Primary Examiner* — Jami M Valentine
(74) *Attorney, Agent, or Firm* — Nath, Goldberg & Meyer; Joshua B. Goldberg; Leonid D. Thenor (57) ABSTRACT

The present invention provides a flexible display substrate, comprising a flexible base; an ultraviolet reflecting layer disposed on the flexible base and capable of reflecting ultraviolet light and transmitting visible light, comprising a stacked structure consisting of alternate first transparent material layers and second transparent material layers, wherein the numbers of the two kinds of transparent material layers are equal, and are at least two respectively, and the two kinds of transparent material layers also satisfy: $4nd=\lambda$, wherein d is the thickness of any one of the transparent material layers, n is a refractive index of the transparent material layer and $\lambda$ is the wavelength of ultraviolet light; and a display structure disposed above the ultraviolet reflecting layer. The present invention is applicable to flexible display substrates, particularly flexible array substrates comprising low-temperature polycrystalline silicon thin film transistors.

20 Claims, 3 Drawing Sheets

(56) References Cited

FOREIGN PATENT DOCUMENTS

| | | |
|---|---|---|
| CN | 103048825 A | 4/2013 |
| CN | 103500745 A | 1/2014 |
| JP | 2006236626 A | 9/2006 |
| WO | 2009146850 A1 | 12/2009 |

OTHER PUBLICATIONS

International Search Report issued in corresponding application PCT/CN2014/076246.

* cited by examiner

FLEXIBLE DISPLAY SUBSTRATE AND MANUFACTURING METHOD THEREOF, AND FLEXIBLE DISPLAY DEVICE

This is a National Phase Application filed under 35 U.S.C. 371 as a national stage of PCT/CN2014/076246, filed Apr. 25, 2014, and claims priority benefit from Chinese Application No. 201310450966.0, filed Sep. 25, 2013, the content of which is hereby incorporated by reference in its entirety.

FIELD OF THE INVENTION

The present invention belongs to the technical field of flexible display, and particularly relates to a flexible display substrate and a manufacturing method thereof, and a flexible display device.

BACKGROUND OF THE INVENTION

With the development of the display technology, flexible display devices are applied more and more widely. The flexible display devices include different types, such as organic light-emitting diode display devices, electrophoretic display devices, liquid crystal display devices and the like. Apparently, a base for a display substrate of a flexible display device (e.g., an array substrate of a flexible organic light-emitting diode display device) must be a flexible base. The flexible base is mainly made of polyimide, polyethylene glycol terephthalate and other organic materials.

Figure 1:
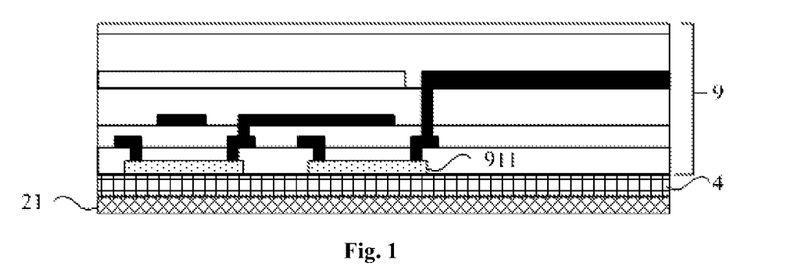
FIG. 1 is a sectional structure diagram of an existing flexible display substrate.
Figure 2:
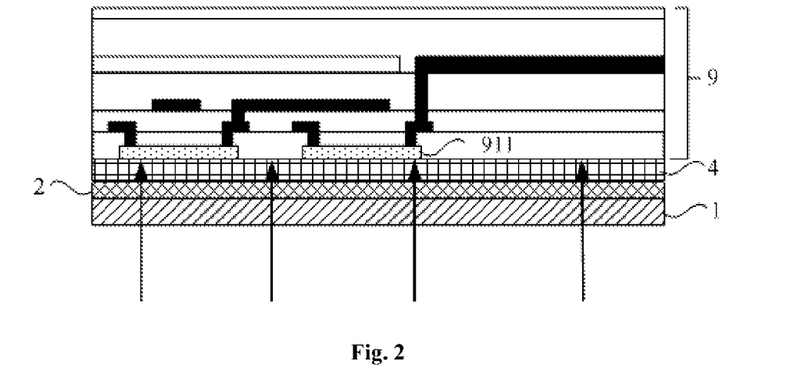
FIG. 2 is a sectional structure diagram of an existing flexible display substrate when laser lift-off is performed in the manufacturing process.

As the flexible base is easy to deform, it is difficult to position, transport and store the flexible base during the preparation process of a display substrate. For this reason, as shown in FIG. 1 and FIG. 2, usually, a flexible material layer 2 is formed on a glass base 1 at first, then a buffer layer 4 and a display structure 9 (including thin film transistors, a data line, a gate line, a capacitor, an anode, a cathode, an organic light-emitting layer, a pixel defining layer and so on, these components being not marked in the figures) are formed on the flexible material layer 2 in turn, and the flexible material layer 2 is irradiated from the glass base 1 side by ultraviolet laser, so that the adhesion between the flexible material layer 2 and the glass base 1 is reduced, and the flexible material layer 2 is thus separated from the glass base 1 (i.e., laser lift-off) so as to form an independent flexible display substrate (at this time, the flexible material layer 2 becomes the flexible base 21).

Meanwhile, a flexible array substrate includes a plurality of display units arranged in form of an array, and each of the display units usually includes a thin film transistor. Low-temperature polycrystalline silicon (LTPS) thin film transistors are one important type of thin film transistors, and the active regions 911 thereof are made of polycrystalline silicon. The manufacturing method of the active regions 911 is as follows: forming an amorphous silicon layer at first, then irradiating the amorphous silicon layer from one side away from the glass base 1 by ultraviolet laser (excimer laser), fusing, nucleating, growing and transforming the amorphous silicon into polycrystalline silicon by excimer laser annealing (ELA), and finally patterning the polycrystalline silicon layer to form the active regions 911.

The inventor(s) has found that at least the following problems exist in the prior art:

First, during laser lift-off, a part of laser may irradiate onto the display structure by passing through the flexible material layer, so that the performance of the display structure is influenced; for example, if the laser irradiates the active layers of the thin film transistors (particularly, metal oxide thin film transistors), threshold voltage drift and other adverse effects will be caused.

Second, for an array substrate having low-temperature polycrystalline silicon thin film transistors, during laser annealing, the laser may irradiate onto the flexible material layer by passing through the amorphous silicon layer, so that the performance of the flexible material layer is damaged, for example, the flexible material layer is carbonized or separated from an adjacent layer (e.g., a buffer layer).

SUMMARY OF THE INVENTION

A technical problem to be solved by the present invention is, in view of the problem that a display structure in an existing flexible display substrate is easy to be damaged during laser lift-off, to provide a flexible display substrate capable of preventing a display structure from damages during laser lift-off and a manufacturing method thereof.

A solution for solving the technical problem of the present invention is a flexible display substrate, which includes:

a flexible base;

an ultraviolet reflecting layer disposed on the flexible base and capable of reflecting ultraviolet light and transmitting visible light, including a stacked structure consisting of first transparent material layers and second transparent material layers which are arranged alternately; and a display structure disposed above the ultraviolet reflecting layer.

Wherein, the "display structure" refers to all structures for displaying formed above the ultraviolet reflecting layer. According to different types of flexible display substrates, the display structure may include: thin film transistors, gate lines, gate insulating layer, data lines, a planarization layer (PLN), a passivation layer (PVX), capacitors, anodes, cathodes, an organic light-emitting layer, a pixel defining layer (PDL), a color filter film, pixel electrodes, common electrodes, common electrode lines, etc.

The number of the first transparent material layers may be equal to the number of the second transparent material layers, and is at least two.

Both the first transparent material layers and the second transparent material layers satisfy: $4nd=\lambda$, wherein d is the thickness of each of the transparent material layers, n is a refractive index of the transparent material layer and $\lambda$ is the wavelength of ultraviolet light.

Each of the first transparent material layers may be a silicon nitride layer being 36 nm in thickness; and each of the second transparent material layers may be a silicon dioxide layer being 52 nm in thickness.

The flexible display substrate may further include: an additional silicon dioxide layer adjacent to an outermost silicon nitride layer in the stacked structure and being 52 nm in thickness; and an additional silicon nitride layer adjacent to an outermost silicon dioxide layer in the stacked structure and being 23.76 nm in thickness.

There may be two to six first transparent material layers.

There may be four first transparent material layers.

Each of the first transparent material layers may be a titanium dioxide layer being 30 nm in thickness; and each of the second transparent material layers may be a silicon dioxide layer being 52 nm in thickness.

There may be two to five first transparent material layers.

There may be three first transparent material layers.

The flexible base may be made of organic flexible material.

The display structure may be a plurality of display units arranged in form of an array; and the display units may include low-temperature polycrystalline silicon thin film transistors.

The flexible display substrate may further include an additional ultraviolet reflecting layer, wherein the display structure may be a plurality of display units arranged in form of an array, and the display units may include thin film transistors; and the additional ultraviolet reflecting layer may be provided on one side of the thin film transistors away from the ultraviolet reflecting layer.

Wherein, the "additional ultraviolet reflecting layer" refers to a layer capable of reflecting ultraviolet light and transmitting visual light, and also includes the above stacked structure and satisfies the above formula.

A solution for solving the technical problem of the present invention is a method for manufacturing the above flexible display substrate, which includes:

forming a flexible material layer on a base;

forming an ultraviolet reflecting layer on the flexible material layer, including: alternately forming first transparent material layers and second transparent material layers to obtain a stacked structure;

forming a display structure; and separating the flexible material layer from the base by laser lift-off to obtain the flexible display substrate.

The number of the first transparent material layers may be equal to the number of the second transparent material layers, and is at least two.

Both the first transparent material layers and the second transparent material layers satisfy: $4nd=\lambda$, wherein d is the thickness of each of the transparent material layers, n is a refractive index of the transparent material layer and $\lambda$ is the wavelength of ultraviolet light.

Each of the first transparent material layers may be a silicon nitride layer being 36 nm in thickness, and each of the second transparent material layers may be a silicon dioxide layer being 52 nm in thickness; and the method may further include: forming, on an outermost silicon nitride layer in the stacked structure, an additional silicon dioxide layer adjacent thereto and being 52 nm in thickness; and forming, on an outermost silicon dioxide layer in the stacked structure, an additional silicon nitride layer adjacent thereto and being 23.76 nm in thickness.

The display structure may include a plurality of display units arranged in form of an array, and the display units may include thin film transistors; and the method may further include: forming an additional ultraviolet reflecting layer on one side of the thin film transistors away from the ultraviolet reflecting layer.

The display structure may include a plurality of display units arranged in form of an array, and the display units may include low-temperature polycrystalline silicon thin film transistors; and the step of forming the display structure may include: forming an amorphous silicon layer; and transforming the amorphous silicon layer into a polycrystalline silicon layer by laser annealing.

Embodiments of the present invention further provide a flexible display device, including the above flexible display substrate.

In the flexible display substrate and the manufacturing method thereof, and the flexible display device provided by the present invention, an ultraviolet reflecting layer is provided between a flexible base (flexible material layer) and a display structure, so the ultraviolet reflecting layer may reflect back the laser passing through the flexible material layer during laser lift-off, so that the laser is prevented from irradiating onto the thin film transistors and other display structures, and thus the display structure is prevented from damages; meanwhile, the ultraviolet reflecting layer allows visual light to pass therethrough, so there are no influences on the normal display and manufacturing process, for example, in the manufacturing process of the flexible display substrate, it is often required to perform alignment by using alignment marks, the ultraviolet reflecting layer has no influences on alignment as it allows visual light to pass therethrough.

In addition, for a flexible array substrate having low-temperature polycrystalline silicon thin film transistors, during laser annealing, the ultraviolet reflecting layer may also reflect laser passing through the amorphous silicon layer, so that the flexible material layer is prevented from damages.

The present invention is applicable to flexible display substrates, particularly flexible array substrates with low-temperature polycrystalline silicon thin film transistors.

Reference numbers in the drawings: 1—Glass base; 2—Flexible material layer; 21—Flexible base; 3—Ultraviolet reflecting layer; 31—Stacked structure; 311—First transparent material layer; 312—Second transparent material layer; 321—Additional silicon nitride layer; 322—Additional silicon dioxide layer; 4—Buffer layer; 9—Display structure; 91—Amorphous silicon layer; and, 911—Active region.

DETAILED DESCRIPTION OF THE EMBODIMENTS

To make those skilled in the art better understand the technical solutions of the present invention, the present invention will be further described as below in details with reference to the accompanying drawings and specific embodiments.

Embodiment 1:

As shown FIGS. 3-7, this embodiment provides a flexible display substrate, including:

a flexible base 21;

an ultraviolet reflecting layer 3 disposed on the flexible base 21, the ultraviolet reflecting layer 3 being capable of reflecting ultraviolet light and transmitting visual light; and a display structure 9 disposed above the ultraviolet reflecting layer 3.

Wherein, the "display structure 9" refers to all structures for displaying formed above the ultraviolet reflecting layer 3. According to different types of flexible display substrates, the display structure 9 may include: a thin film transistor, a gate line, a gate insulating layer, a data line, a planarization layer (PLN), a passivation layer (PVX), a capacitor, an anode, a cathode, an organic light-emitting layer, a pixel defining layer (PDL), a color filter film, a pixel electrode, a common electrode, a common electrode line, etc.

Figure 7:
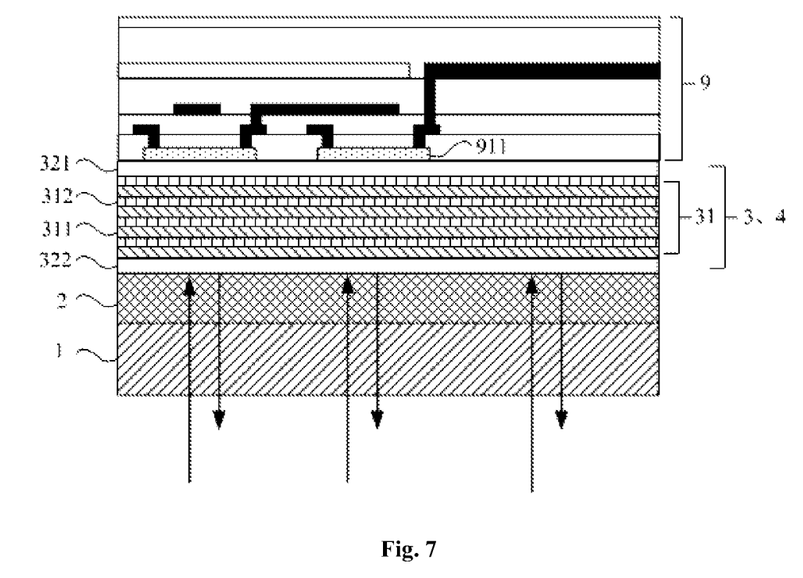
FIG. 7 is a sectional structure diagram of a flexible display substrate of Embodiment 1 of the present invention when laser lift-off is performed in the manufacturing process.

In the flexible display substrate of this embodiment, the ultraviolet reflecting layer 3 is provided between the flexible base 21 and the display structure 9, so the ultraviolet reflecting layer 3 may reflect back laser passing through the flexible material layer 2 during laser lift-off, as shown in FIG. 7, so that the laser is prevented from irradiating onto the display structure 9 including the thin film transistor, etc, and the performance of the display structure 9 is thus prevented from being influenced. Meanwhile, the ultraviolet reflecting layer 3 allows visual light to pass therethrough, so there are no influences on the normal display and manufacturing process. For example, in the manufacturing process of the flexible display substrate, it is often required to perform alignment by using alignment marks, the ultraviolet reflecting layer has no influences on alignment as it allows visual light to pass therethrough.

For example, in this embodiment, by taking an array substrate of a flexible organic light-emitting diode display device as a flexible display substrate example, the flexible display substrate includes a driving circuit (switch thin film transistors, driving thin film transistors, capacitors, etc.), a gate line, a data line, a cathode, an anode, an organic light-emitting layer, a pixel defining layer and other structures.

Figure 3:
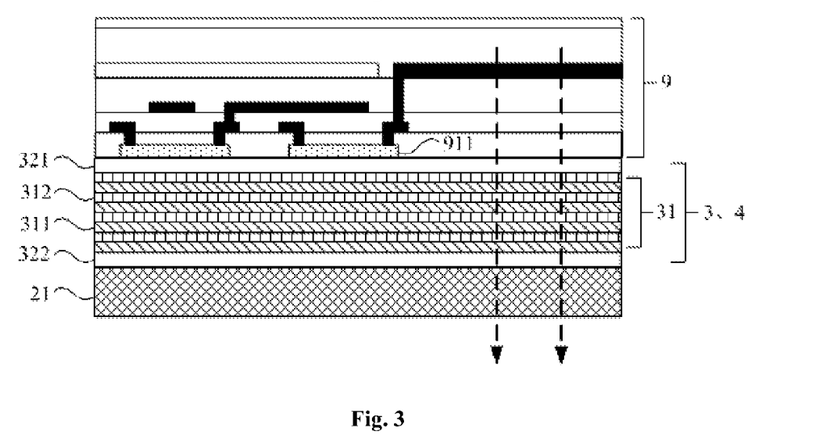
FIG. 3 is a sectional structure diagram of a flexible display substrate of Embodiment 1 of the present invention.

As shown in FIG. 3, the flexible array substrate includes a plurality of display units arranged in form of an array, and each of the display units usually includes a thin film transistor. However, the active regions 911 of the thin film transistor (particularly metal oxide thin film transistor) are the most likely influenced portion of the display structure 9 during laser lift-off, so the protection effect of the ultraviolet reflecting layer 3 on the array substrate is the most apparent.

Of course, it should be understood that, although this embodiment takes an array substrate of a flexible organic light-emitting diode display device as a flexible display substrate example, the flexible display substrate may also be a flexible color film substrate, a flexible closed substrate, an array substrate of a flexible liquid crystal display device, or other types of display substrates.

For example, for a flexible array substrate, low-temperature polycrystalline silicon thin film transistors may be employed, that is, the active regions 911 of the thin film transistors are made of low-temperature polycrystalline silicon material.

For the low-temperature polycrystalline silicon thin film transistor, the active region 911 therein is formed by forming an amorphous silicon layer 91 at first and then transforming the amorphous silicon layer 91 into a polycrystalline silicon layer by crystallization technology. The typical method is laser annealing technology. In the laser annealing crystallization process, a part of laser may pass through the amorphous silicon layer 91 and thus damage the flexible base 21. In this embodiment, the ultraviolet reflecting layer 3 may also reflect back the laser, so that the flexible base 21 is prevented from being damaged during laser annealing.

Of course, it should be understood that, the thin film transistors in the flexible display substrate of the present invention are also not limited to low-temperature polycrystalline silicon thin film transistors, for example, and may also be amorphous silicon thin film transistors, oxide thin film transistors, etc.; the crystallization technology is not limited to laser annealing technology, and may also be metal induced crystallization, solid phase crystallization, etc.

For example, the flexible base 21 is made of organic flexible material, typically polyimide or polyethylene glycol terephthalate.

On one hand, the technology for manufacturing the flexible base 21 from organic flexible material is mature and common; on the other hand, the organic flexible material is more likely to be damaged by laser, and it will be more advantageous to adopt embodiments of the present invention.

Specially, the ultraviolet reflecting layer 3 includes a stacked structure 31 consisting of first transparent material layers 311 and second transparent material layers 312 arranged alternately, the numbers of the two kinds of transparent material layers are equal, and are at least two respectively.

In other words, the main body of the ultraviolet reflecting layer 3 is a multilayer structure (the stacked structure 31) consisting of two kinds of different transparent material layers alternately arranged, i.e., a cycle structure of "first transparent material layer 311-second transparent material layer 312-first transparent material layer 311-second transparent material layer 312", wherein the numbers of the two kinds of material layers are equal, that is, the first transparent material layers 311 and the second transparent material layers 312 are certainly "paired"; meanwhile, the number of each kind of material layers is at least two, so that the stacked structure 31 has at least four layers in total.

Of course, it should be understood that, the alternate arrangement of the above first transparent material layers 311 and second transparent material layers 312 merely shows an arrangement relationship between the two kinds of layers, but does not represent a particular position relationship between the material layers and the flexible base 21. That is, the material layer closest to the flexible base 21 may be a first transparent material layer 311 or a second transparent material layer 312. Meanwhile, outside the stacked structure 31, it is feasible to have other independent layers made of the first transparent material or the second transparent material, but these layers do not belong to the stacked structure 31.

Moreover, both the first transparent material layers 311 and the second transparent material layers 312 satisfy a formula $4nd=\lambda$, wherein d is the thickness of any of the transparent material layers, n is a refractive index of the transparent material layer and $\lambda$ is the wavelength of ultraviolet light to be reflected.

Although both the first transparent material layers 311 and the second transparent material layers 312 are transparent, the stacked structure 31 formed from the first transparent material layers and the second transparent material layers may play a role of reflecting ultraviolet light having a certain wavelength when the thicknesses and refractive indexes of the two kinds of transparent material layers satisfy the above relation. Therefore, the specific materials and thicknesses of the first transparent material layers 311 and the second transparent material layers 312 may be selected according to the wavelength of desirably reflected ultraviolet light.

It should be understood that, according to the above formula, the stacked structure 31 has the highest reflectivity to light having wavelength $\lambda$ and also has high reflectivity to light having wavelength close to $\lambda$, so it is not true that the stacked structure 31 only has reflectivity to light having wavelength at one "point".

For example, each of the first transparent material layers 311 is a silicon nitride layer being 36 nm in thickness, and each of the second transparent material layers 312 is a silicon dioxide layer being 52 nm in thickness.

The reason why the above materials and thicknesses are employed is as follows:

First, generally, ultraviolet laser being 308 nm in wavelength are used during both laser lift-off and excimer laser annealing. Under the conventional technological conditions, the reflective index of silicon nitride prepared by Plasma Enhanced Chemical Vapor Deposition (PECVD) at wavelength of 308 nm is 2.14, while the reflective index of a silicon dioxide layer at wavelength of 308 nm is 1.48, so the above formula is just satisfied in combination with the above thickness. Of source, for different technologies or different parameters of the plasma enhanced chemical vapor deposition, the refractive indexes of the prepared silicon nitride and silicon oxide will also be varied. In this case, the thickness will be changed correspondingly as long as the formula 4nd=λ is satisfied.

Second, in a flexible display substrate, it is usually required to form a buffer layer 4 on the flexible base 21 at first and then form the display structure 9 on the buffer layer 4. The buffer layer 4 has the effects of reducing surface roughness, improving the bonding of the display structure 9 with the flexible base 21, and protecting the flexible base 21 during the laser annealing crystallization process of the flexible array substrate including low-temperature polycrystalline silicon thin film transistors. The buffer layer 4 is usually made of silicon nitride or silicon dioxide or mixed material of silicon nitride and silicon dioxide, so the ultraviolet reflecting layer 3 may also function as the buffer layer 4. Therefore, it is unnecessary to provide a separate buffer layer 4, so that the structure of the flexible display substrate is simplified. Of course, it is feasible to provide the ultraviolet reflecting layer 3 and simultaneously provide a separate buffer layer 4 on the ultraviolet reflecting layer 3.

Figure 6:
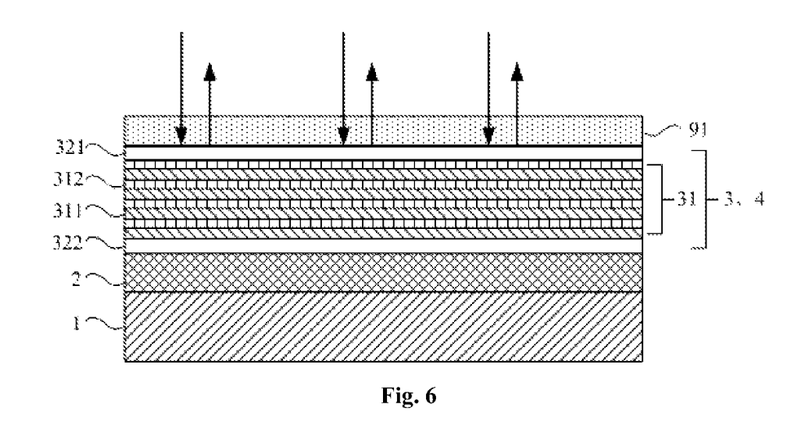
FIG. 6 is a sectional structure diagram of a flexible display substrate of Embodiment 1 of the present invention when laser annealing is performed in the manufacturing process.

For another example, as shown in FIG. 3, FIG. 6 and FIG. 7, the ultraviolet reflecting layer 3 further includes: an additional silicon dioxide layer 322 adjacent to an outermost silicon nitride layer (i.e., the first transparent material layer 311) in the stacked structure 31 and being 52 nm in thickness; and an additional silicon nitride layer 321 adjacent to an outermost silicon dioxide layer (i.e., the second transparent material layer 312) in the stacked structure 31, the additional silicon nitride layer 321 has a thickness of 23.76 nm, which is 0.66 times of thickness of the silicon nitride layer in the stacked structure 31.

In other words, the additional silicon dioxide layer 322 and the additional silicon nitride layer 321 may be further respectively provided on two sides of the stacked structure 31. The additional silicon dioxide layer 322 is adjacent to the outermost silicon nitride layer of the stacked structure 31, while the additional silicon nitride layer 321 is adjacent to the outermost silicon dioxide layer of the stacked structure 31, wherein the thickness of the additional silicon dioxide layer 322 is 52 nm, which is the same as the thickness of the silicon dioxide layer in the stacked structure, while the thickness of the additional silicon nitride layer 321 is 0.66×36=23.76 nm, that is, the thickness of the additional silicon nitride layer is smaller than that of the silicon nitride layer in the stacked structure.

The reason why the additional silicon dioxide layer 322 and the additional silicon nitride layer 321 are additionally provided is as follows: it is found from analog computation that the addition of the above layers may improve the reflectivity to ultraviolet light (ultraviolet light having wavelength of 308 nm) without obviously reducing the transmittance of visual light.

In the stacked structure 31 consisting of the silicon dioxide layers and the silicon nitride layers, wherein the number of the first transparent material layers 311 may be 2-6, for example 4.

In other words, the total number of the layers in the stacked structure 31 may be 4-12, for example 8.

Figure 4:
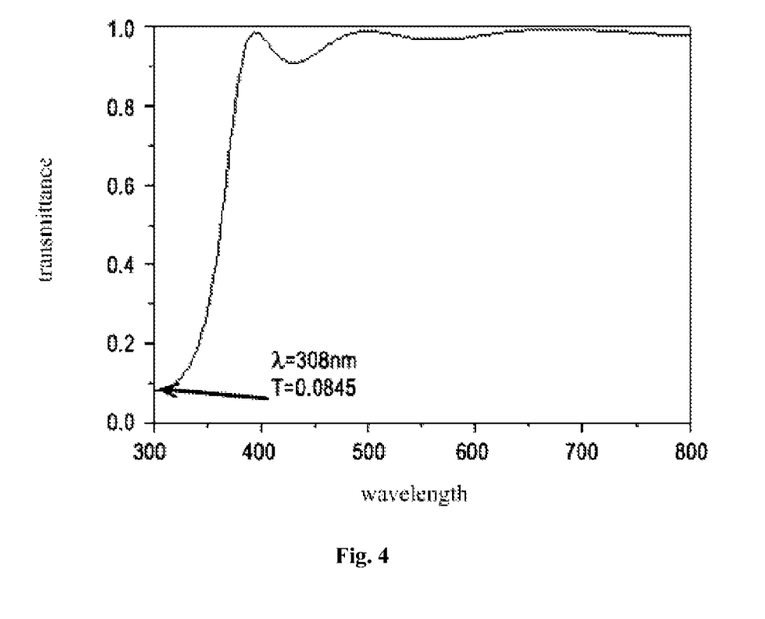
FIG. 4 is a curve diagram of the visual light transmittance of an ultraviolet reflecting layer of Embodiment 1 of the present invention.
Figure 5:
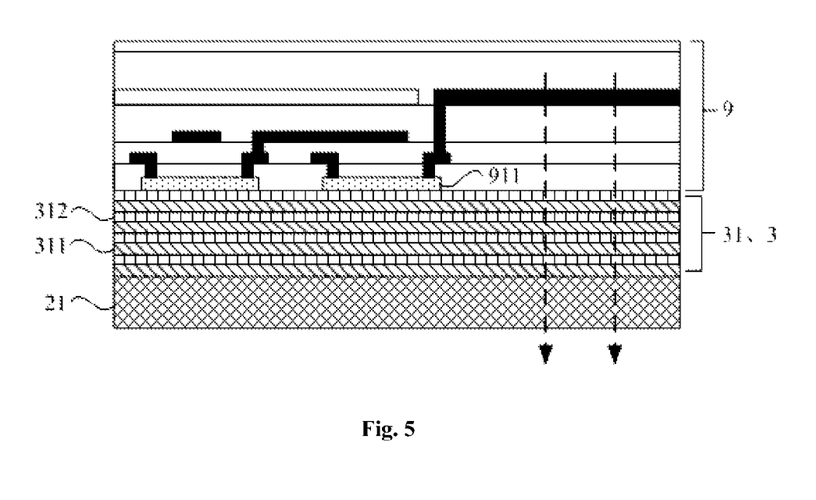
FIG. 5 is a sectional structure diagram of another flexible display substrate of Embodiment 1 of the present invention.

Apparently, the more the total number of the layers in the stacked structure 31 is, the better the reflection effect of the stacked structure on ultraviolet light. However, inevitably, the transmittance of visual light will also be reduced, and the manufacturing cost will be increased and so on. Researches show that the stacked structure 31 having four to twelve layers in total may reflect majority of ultraviolet light and may also allow majority of visual light to pass therethrough, thus to achieve best effects. Wherein, when the ultraviolet reflecting layer 3 includes the stacked structure 31 (having eight layers in total) as well as the additional silicon dioxide layer 322 and the additional silicon nitride layer 321, the curve of the transmittance of visual light is as shown in FIG. 4. It can be seen from FIG. 4 that the ultraviolet reflecting layer 3 has high reflectivity to light having the wavelength of ultraviolet light (the reflectivity to ultraviolet light having wavelength of 308 nm may reach 92%), while the transmittance to light having the wavelength of visual light may be above 90%.

Each of the first transparent material layers 311 may also be a titanium dioxide layer being 30 nm in thickness, and each of the second transparent material layers 312 may be a silicon dioxide layer being 52 nm in thickness.

In other words, the titanium dioxide layers and silicon dioxide layers within the above thickness range may also be used as the first transparent material layers 311 and the second transparent material layers 312. As the refractive index of titanium dioxide is larger than that of silicon nitride, the thickness of each of the titanium dioxide layers is smaller than that of each of the silicon nitride layers.

In the stacked structure 31 consisting of the titanium dioxide layers and silicon dioxide layers, the number of the first transparent material layers 311 may be 2-5, for example 3.

In other words, in the stacked structure 31 consisting of the titanium dioxide layers and silicon dioxide layers, the total number of the layers may be 4-10, for example 6. In this case, the reflectivity of the stacked structure to ultraviolet light having wavelength of 308 nm is 89%, while the transmittance to visual light is above 90%.

Of course, it should be understood that the above description merely shows a part of specific examples of the first transparent material layers 311 and the second transparent material layers 312, and it is feasible to use other materials to manufacture the first transparent material layers 311 and the second transparent material layers 312 as long as the purpose of reflecting ultraviolet light and transmitting visual light may be achieved.

For example, when the flexible display substrate is a flexible array substrate, the display structure therein includes a plurality of display units arranged in form of an array, and each of the display units usually includes a thin film transistor (e.g., metal oxide thin film transistor), an additional ultraviolet reflecting layer may be further provided on an outer side of the thin film transistors (one side of the thin film transistors away from the ultraviolet reflecting layer). Wherein, the "additional ultraviolet reflecting layer" also refers to a layer capable of reflecting ultraviolet light and transmitting visual light, and also includes the stacked structure and satisfies the above formula.

As the active regions of the thin film transistors are likely to be influenced by the irradiation of ultraviolet light, in order to prevent ultraviolet light in ambient light from affecting the active regions of the thin film transistors, an additional ultraviolet reflecting layer may be provided on an outer side of the thin film transistors. Wherein, the additional ultraviolet reflecting layer may function as a passivation layer disposed between the thin film transistors and the organic light-emitting diodes and may also function as a package structure disposed on an outer layer of the organic light-emitting diodes and the like. Of course, the additional ultraviolet reflecting layer may also function as an additional structure disposed on the outer side of the thin film transistors as long as the additional ultraviolet reflecting layer may prevent external ultraviolet light from irradiating onto the thin film transistors.

This embodiment further provides a method for manufacturing the above flexible display substrate, which includes the following steps:

S01: A base is prepared.

The base may be a glass base 1 or other conventional hard base.

S02: A flexible material layer 2 is formed on the base.

The flexible material layer 2 may be an organic flexible material layer 2, for example, a layer made of polyimide or polyethylene glycol terephthalate.

The flexible material layer 2 may be manufactured by coating or other conventional methods. In the subsequent laser lift-off step, the flexible material layer 2 will be separated from the glass base 1 so as to form the flexible base 21 of the flexible display substrate.

S03: An ultraviolet reflecting layer 3 is formed on the flexible material layer 2.

Specially, this step includes: alternately forming first transparent material layers 311 and second transparent material layers 312 to obtain a stacked structure 31. When the ultraviolet reflecting layer 3 includes an additional silicon dioxide layer 322 and an additional silicon nitride layer 321, this step further includes: respectively forming the two additional layers before and after the stacked structure 31 is formed.

Wherein, the forming method of the first transparent material layers 311 and the second transparent material layers 312 may be determined according to specific material.

Generally, the stacked structure consisting of silicon dioxide and silicon nitride may be manufactured by a plasma enhanced chemical vapor deposition method, it is only to change the introduced reactant gas during deposition. For example, the reactant gas used for forming the silicon nitride layers may be mixed gas of $SiH_4$, $NH_3$ and $N_2$, while the reactant gas used for forming the silicon dioxide layers may be mixed gas of $SiH_4$, $NO_2$ and $N_2$. By alternately introducing different reactant gas and controlling reaction parameters, the above stacked structure 31 may be obtained. The titanium dioxide layers may be usually prepared by an electron beam evaporation method.

The thickness of each of the layers in the stacked structure 31 may be calculated according to a deposition rate and deposition time, or may also be determined by detecting film thickness.

S04: An amorphous silicon layer 91 may be formed.

Wherein, the amorphous silicon layer 91 may be formed by a chemical vapor deposition method and has a thickness, for example, of 40-60 nm S05: The amorphous silicon layer 91 may be transformed into a polycrystalline silicon layer by laser annealing (excimer laser annealing), as shown in FIG. 6.

Wherein, the laser used in laser annealing may be ultraviolet laser having, for example, wavelength of 308 nm As shown in FIG. 6, in the laser annealing process, due to the presence of the ultraviolet reflecting layer 3, laser passing through the amorphous silicon layer 91 will be reflected back by the ultraviolet reflecting layer 3 and thus will not irradiate onto the flexible material layer 2, so that the flexible material layer 2 will not be damaged.

The active regions 911 of the thin film transistors manufactured according to the method in this embodiment are close to the flexible base 21, that is, the thin film transistors belong to "top gate type thin film transistors". However, apparently, bottom gate type thin film transistors are also applicable to the present invention, with a difference that gates/gate lines, gate insulating layers and other structures need to be formed at first and then the amorphous silicon layer 91 is manufactured in the manufacturing process.

It should be understood that it is also feasible to use metal oxide thin film transistors or other types of thin film transistors in the flexible array substrate manufactured by the method in this embodiment. In this case, it is unnecessary to perform laser annealing, and it is only needed to form the metal oxide layers.

S06: Other portions of the display structure 9 are sequentially formed.

Specifically, this step may include: forming active regions 911 from the polycrystalline silicon by patterning technology, and further forming a gate insulating layer, gates/gate lines, sources/drains, a passivation layer, data lines, a planarization layer, anodes, a pixel defining layer, an organic light-emitting layer, cathodes, a color filter film, etc.

Apparently, in this step, the specific type, structure and position of the formed display structure 9 and the technologies, sequences and parameters for forming various display structures 9 are different according to different types of flexible display substrates (for example, an array substrate of a flexible liquid crystal display device includes pixel electrodes, common electrode lines or other structures), but these will not be described in details herein.

S07: As shown FIG. 7, laser lift-off is performed on the flexible material layer 2 to obtain the flexible display substrate.

In other words, ultraviolet laser (for example, having wavelength of 308 nm) irradiates the flexible material layer 2 from one side of the glass base 1, so that the flexible material layer 2 and the display structure thereon are separated from the glass base 1 to form an independent flexible display substrate. At this time, the flexible material layer 2 becomes the flexible base 21 of the flexible display substrate.

As shown in FIG. 7, in the laser lift-off process, due to the presence of the ultraviolet reflecting layer 3, laser passing through the flexible material layer 2 will be reflected back by the ultraviolet reflecting layer 3 and thus will not irradiate onto the display structure 9 including thin film transistors and the like, so that the display structure 9 will not be damaged.

Embodiment 2:

The embodiment of the present invention further provides a flexible display device, including the flexible display substrate of Embodiment 1. The flexible display device may be a flexible liquid crystal display device, a flexible organic light-emitting diode display device, etc.

It will be appreciated that the foregoing embodiments are merely exemplary embodiments used for describing the principle of the present invention, and the present invention is not limited thereto. Those of ordinary skill in the art may make various variations and improvements without departing from the spirit and essence of the present invention, and these variations and improvements shall fall into the protection scope of the present invention.

The invention claimed is:

1. A flexible display substrate, comprising a flexible base, characterized in that the flexible display substrate further comprises:
   an ultraviolet reflecting layer disposed on the flexible base and capable of reflecting ultraviolet light and transmitting visible light, comprising a stacked structure consisting of first transparent material layers and second transparent material layers which are arranged alternately; and
   a display structure including a thin film transistor disposed above the ultraviolet reflecting layer.

2. The flexible display substrate according to claim 1, characterized in that,
   the number of the first transparent material layers is equal to the number of the second transparent material layers, and is at least two.

3. The flexible display substrate according to claim 1, characterized in that,
   both the first transparent material layers and the second transparent material layers satisfy: $4nd=\lambda$, wherein d is the thickness of each of the transparent material layers, n is a refractive index of the transparent material layer and $\lambda$ is the wavelength of ultraviolet light.

4. The flexible display substrate according to claim 1, characterized in that,
   each of the first transparent material layers is a silicon nitride layer being 36 nm in thickness; and
   each of the second transparent material layers is a silicon dioxide layer being 52 nm in thickness.

5. The flexible display substrate according to claim 4, characterized by further comprising:
   an additional silicon dioxide layer adjacent to an outermost silicon nitride layer in the stacked structure and being 52 nm in thickness; and
   an additional silicon nitride layer adjacent to an outermost silicon dioxide layer in the stacked structure and being 23.76 nm in thickness.

6. The flexible display substrate according to claim 4, characterized in that,
   the number of the first transparent material layers is 2-6.

7. The flexible display substrate according to claim 6, characterized in that,
   the number of the first transparent material layers is 4.

8. The flexible display substrate according to claim 1, characterized in that,
   each of the first transparent material layers is a titanium dioxide layer being 30 nm in thickness; and
   each of the second transparent material layers is a silicon dioxide layer being 52 nm in thickness.

9. The flexible display substrate according to claim 8, characterized in that,
   the number of the first transparent material layers is 2-5.

10. The flexible display substrate according to claim 9, characterized in that,
    the number of the first transparent material layers is 3.

11. The flexible display substrate according to claim 1, characterized in that,
    the flexible base is made of organic flexible material.

12. The flexible display substrate according to claim 1, characterized in that,
    the display structure comprises a plurality of display units arranged in form of an array; and
    the display units comprise low-temperature polycrystalline silicon thin film transistors.

13. The flexible display substrate according to claim 1, characterized by further comprising an additional ultraviolet reflecting layer,
    wherein the display structure comprises a plurality of display units arranged in form of an array, the display units comprising thin film transistors; and
    the additional ultraviolet reflecting layer is provided on one side of the thin film transistors away from the ultraviolet reflecting layer.

14. A manufacturing method of the flexible display substrate according to claim 1, comprising:
    forming a flexible material layer on a base;
    forming an ultraviolet reflecting layer on the flexible material layer, comprising: alternately forming first transparent material layers and second transparent material layers to obtain a stacked structure;
    forming a display structure including a thin film transistor; and
    separating the flexible material layer from the base by laser lift-off to obtain the flexible display substrate.

15. The manufacturing method of the flexible display substrate according to claim 14, characterized in that,
    the number of the first transparent material layers is equal to the number of the second transparent material layers, and is at least 2.

16. The manufacturing method of the flexible display substrate according to claim 14, characterized in that,
    both the first transparent material layers and the second transparent material layers satisfy: $4nd=\lambda$, wherein d is the thickness of each of the transparent material layers, n is a refractive index of the transparent material layer and $\lambda$ is the wavelength of ultraviolet light.

17. The manufacturing method of the flexible display substrate according to claim 14, characterized in that each of the first transparent material layers is a silicon nitride layer being 36 nm in thickness, and each of the second transparent material layers is a silicon dioxide layer having 52 nm in thickness; and the method further comprises:
    forming, on an outermost silicon nitride layer in the stacked structure, an additional silicon dioxide layer adjacent thereto and being 52 nm in thickness; and
    forming, on an outermost silicon dioxide layer in the stacked structure, an additional silicon nitride layer adjacent thereto and being 23.76 nm in thickness.

18. The manufacturing method of the flexible display substrate according to claim 14, characterized in that the display structure comprises a plurality of display units arranged in form of an array, and the display units comprise thin film transistors; and the method further comprises:
    forming an additional ultraviolet reflecting layer on one side of the thin film transistors away from the ultraviolet reflecting layer.

19. The manufacturing method of the flexible display substrate according to claim 14, characterized in that the display structure comprises a plurality of display units arranged in form of an array, the display units comprising low-temperature polycrystalline silicon thin film transistors; and
    the step of forming the display structure comprises:
    forming an amorphous silicon layer; and
    transforming the amorphous silicon layer into a polycrystalline silicon layer by laser annealing.

20. A flexible display device, comprising the flexible display substrate according to claim 1.

* * * * *